(12) United States Patent
Oh

(10) Patent No.: US 12,114,448 B2
(45) Date of Patent: Oct. 8, 2024

(54) DEVICE FOR VARYING SHAPE OF DISPLAY PANEL, AND CURVED DISPLAY APPARATUS EQUIPPED WITH SAME

(71) Applicant: TOVIS CO., LTD., Incheon (KR)

(72) Inventor: Chang Min Oh, Incheon (KR)

(73) Assignee: TOVIS CO., LTD., Incheon (KR)

( * ) Notice: Subject to any disclaimer, the term of this patent is extended or adjusted under 35 U.S.C. 154(b) by 303 days.

(21) Appl. No.: 17/797,441

(22) PCT Filed: Jan. 11, 2021

(86) PCT No.: PCT/KR2021/000289
§ 371 (c)(1),
(2) Date: Aug. 4, 2022

(87) PCT Pub. No.: WO2021/157881
PCT Pub. Date: Aug. 12, 2021

(65) Prior Publication Data
US 2023/0072005 A1    Mar. 9, 2023

(30) Foreign Application Priority Data
Feb. 7, 2020   (KR) .................. 10-2020-0015125

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
None
See application file for complete search history.

(56) References Cited

U.S. PATENT DOCUMENTS

2013/0207946 A1   8/2013   Kim et al.
2014/0003006 A1   2/2014   Ahn
2016/0295711 A1*  10/2016  Ryu .................. G09F 9/33
(Continued)

FOREIGN PATENT DOCUMENTS

KR   10-2013-0117110 A   10/2013
KR   10-2014-0067535 A   6/2014
KR      10-1399209 B1    6/2014
(Continued)

OTHER PUBLICATIONS

International Search Report for PCT/KR2021/000289 mailed Jun. 7, 2021 from Korean Intellectual Property Office.

*Primary Examiner* — Jerry Wu
(74) *Attorney, Agent, or Firm* — Revolution IP, PLLC

(57) ABSTRACT

A device for varying the shape of a display panel includes: a variable case in which a flexible display panel is installed, the variable case having a variable shape that can be changed in order to change the shape of the display panel; and a driving unit for driving the variable case. The variable case includes: a first curved accommodation portion by which one end of the display panel is bent into a curved surface and fixed; a second curved accommodation portion by which the other end of the display panel is bent into a curved surface and fixed so that the one end and other end of the display panel form a single curved surface; and a hinge portion which rotatably connects the first curved accommodation portion and the second curved accommodation portion.

6 Claims, 11 Drawing Sheets

(56) References Cited

U.S. PATENT DOCUMENTS

2016/0324017 A1    11/2016  Cho et al.
2017/0292503 A1*   10/2017  Lee ..................... G06F 1/1626

FOREIGN PATENT DOCUMENTS

| KR | 10-1507206 B1 | 3/2015 |
| KR | 10-2016-0128021 A | 11/2016 |
| WO | 2017-209744 A1 | 12/2017 |

* cited by examiner

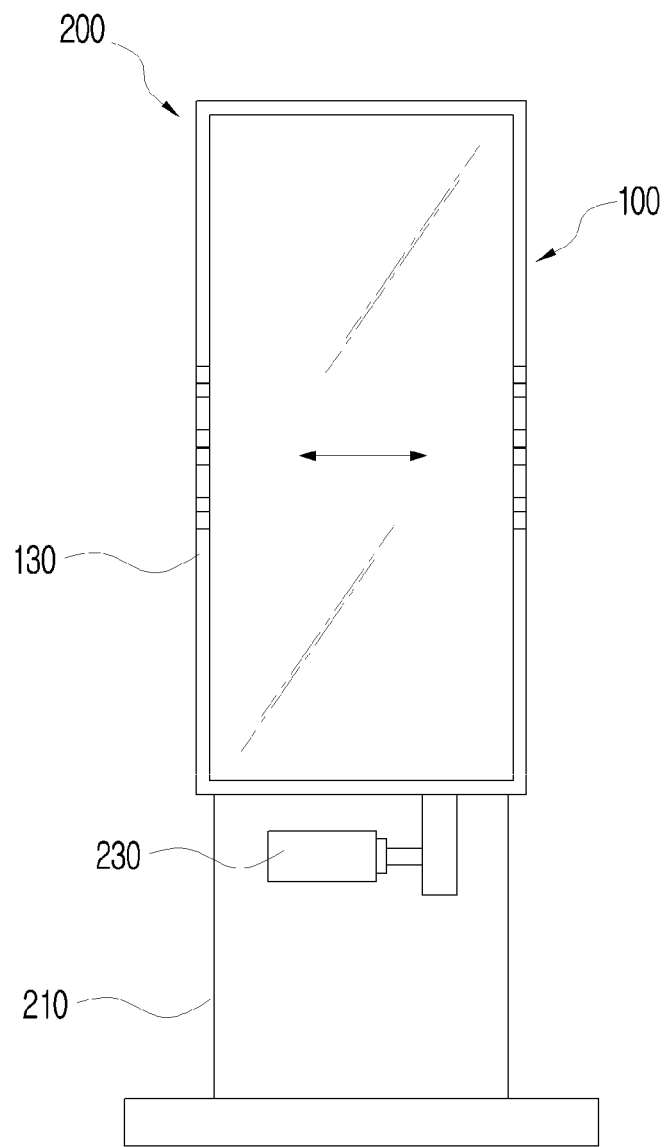

DEVICE FOR VARYING SHAPE OF DISPLAY PANEL, AND CURVED DISPLAY APPARATUS EQUIPPED WITH SAME

TECHNICAL FIELD

The present invention relates to a device for varying the shape of a display panel, wherein the device varies the shape of a curved display panel configured to display an image, and a curved display apparatus equipped with the same.

BACKGROUND ART

In general, a display apparatus is an apparatus for outputting an image based on an image source received thereby.

The display apparatus is manufactured so as to have a flat shape in order to display an image. In recent years, however, a curved display apparatus bent so as to have a curved surface has been disclosed in order to improve immersion in an image.

The curved display apparatus is manufactured in the state in which a flexible display panel is received and fixed in a curved case or a curve retention member is attached to the flexible display panel such that the display panel is curved.

Since the curved display apparatus is manufactured so as to have a predetermined curvature, however, when it is necessary to change the radius of curvature or consumers require the shape of the curved display apparatus to be changed, it is difficult to manufacture the curved display apparatus so as to correspond thereto. Even though the display apparatus displays an image in a curved state, consumers may not perceive a substantial visual difference.

In order to solve these problems, Korean Patent Application Publication No. 10-2016-0128021 (published on Nov. 7, 2016) discloses VARIABLE DRIVING DEVICE FOR VARIABLE DISPLAYS.

In the conventional variable driving device for variable displays, a display panel is bent by operation of a gear box in the state in which the display panel is spread so as to have a flat shape such that the display panel is bent or spread at a curvature desired by a user.

In the conventional variable driving device for variable displays, it is possible to change the curvature of the display panel, but it is difficult to change the shape of the display panel, whereby it is not possible to provide various visual effects. Furthermore, a visual aesthetic sense and concentration of attention are reduced due to change in shape of the display panel.

DISCLOSURE

Technical Problem

The present invention has been made in view of the above problems, and it is an object of the present invention to provide a device for varying the shape of a display panel capable of varying the shape of the display panel to a plurality of curved surfaces as well as a single curved surface, thereby providing various visual effects and improving concentration of attention together with a visual aesthetic sense, and a curved display apparatus equipped with the same.

Technical Solution

A device for varying the shape of a display panel according to an embodiment of the present invention to accomplish the above object includes a variable case configured to allow a flexible display panel to be installed therein, the shape of the variable case being varied to vary the shape of the display panel, and a driving unit configured to drive the variable case, wherein the variable case includes a first curved surface receiving portion configured to fix one end of the display panel in a state of being bent in a curved shape, a second curved surface receiving portion configured to fix the other end of the display panel in a state of being bent in a curved shape so as to constitute a single curved surface together with the one end of the display panel, and a hinge portion configured to turnably connect the first curved surface receiving portion and the second curved surface receiving portion to each other, the hinge portion being configured to turn the first curved surface receiving portion and the second curved surface receiving portion such that the single curved surface of the display panel is varied to a plurality of curved surfaces.

The hinge portion may include a hinge connector configured to connect the first curved surface receiving portion and the second curved surface receiving portion to each other in a state of being spaced apart from each other by a predetermined distance so as to prevent damage to the display panel due to bending thereof.

The hinge connector may include a plurality of hinge connectors connected to each other so as to be turnable relative to each other, the plurality of hinge connectors being configured to connect the first curved surface receiving portion and the second curved surface receiving portion to each other.

The hinge portion may turn the first curved surface receiving portion or the second curved surface receiving portion so as to have a curved surface reverse to the curved surface of the one end or the other end of the display panel.

The driving unit may include a driving bracket installed at the rear of the variable case, the driving bracket being configured to turn the first curved surface receiving portion or the second curved surface receiving portion relative to the hinge portion.

The driving bracket may include a first support portion turnably coupled to the first curved surface receiving portion, the first support portion being configured to pull or push the first curved surface receiving portion such that the first curved surface receiving portion is turned relative to the hinge portion, a second support portion turnably coupled to the second curved surface receiving portion, the second support portion being configured to pull or push the second curved surface receiving portion such that the second curved surface receiving portion is turned relative to the hinge portion, and a bracket connection portion configured to turnably connect the first support portion and the second support portion to each other.

The driving unit may include a variable driving mechanism configured to pull or push the driving bracket such that the first support portion and the second support portion are turned relative to the hinge portion.

The variable case may include a backlight unit installed at the rear of the display panel, the backlight unit being configured to provide light to the display panel, the backlight unit being bent together with the display panel depending on change in shape of the variable case.

A curved display apparatus equipped with a device for varying the shape of a display panel according to an embodiment of the present invention includes the device for varying the shape of the display panel according to the above embodiment, a display main body configured to allow the device for varying the shape of the display panel to be installed therein, and a panel position changing mechanism configured to change the position of the device for varying the shape of the display panel in the display main body in order to achieve change in center of gravity or a visual effect due to change in shape of the display panel varied by the device for varying the shape of the display panel.

Advantageous Effects

According to the present invention, it is possible to vary the shape of a single curved display panel to a shape including a plurality of curved surfaces, whereby it is possible to provide visual effects, and it is possible to improve the visual effects and the concentration of attention based on the varied shape of the display panel.

DESCRIPTION OF DRAWINGS

FIG. 11 is a front view showing the curved display apparatus equipped with the device for varying the shape of the display panel according to the embodiment of the present invention.

DESCRIPTION OF REFERENCE SYMBOLS

Figure 1:
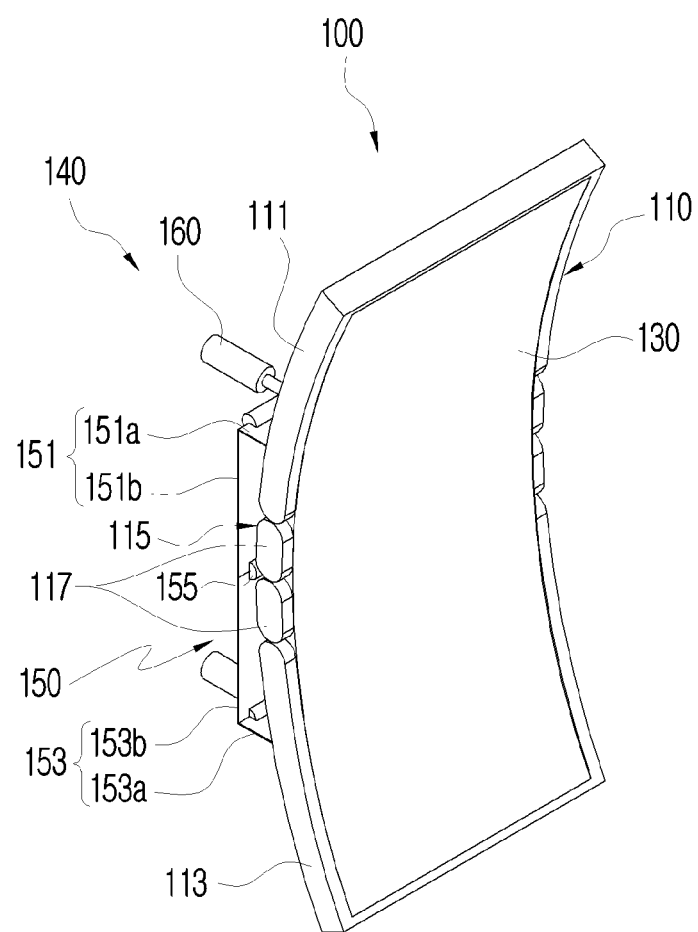
FIG. 1 is a front perspective view showing a device for varying the shape of a display panel according to a first embodiment of the present invention.
Figure 2:
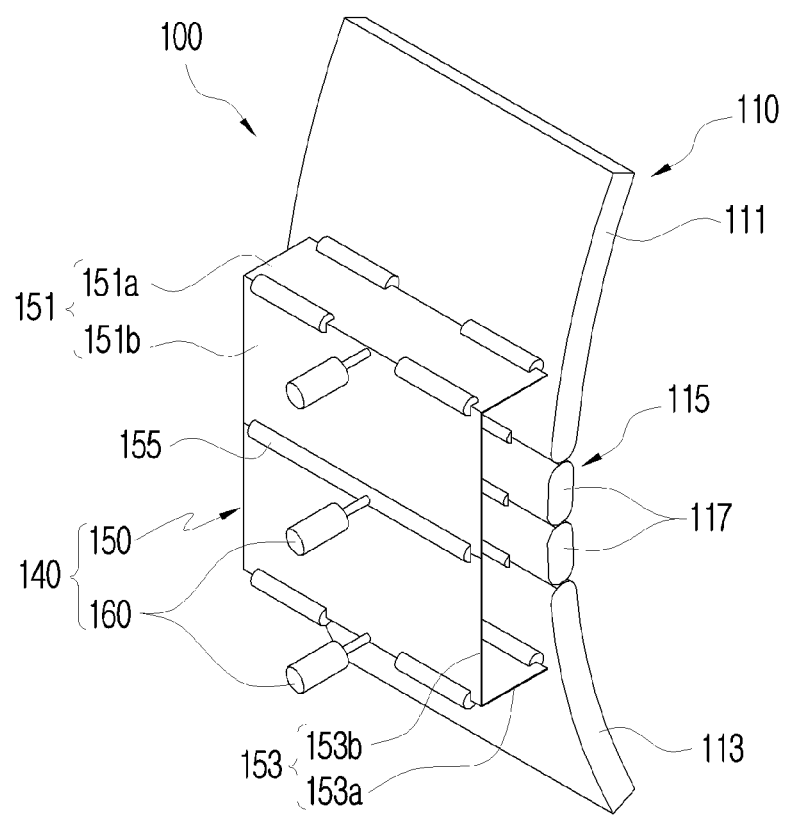
FIG. 2 is a rear perspective view showing the device for varying the shape of the display panel according to the first embodiment of the present invention.
Figure 3:
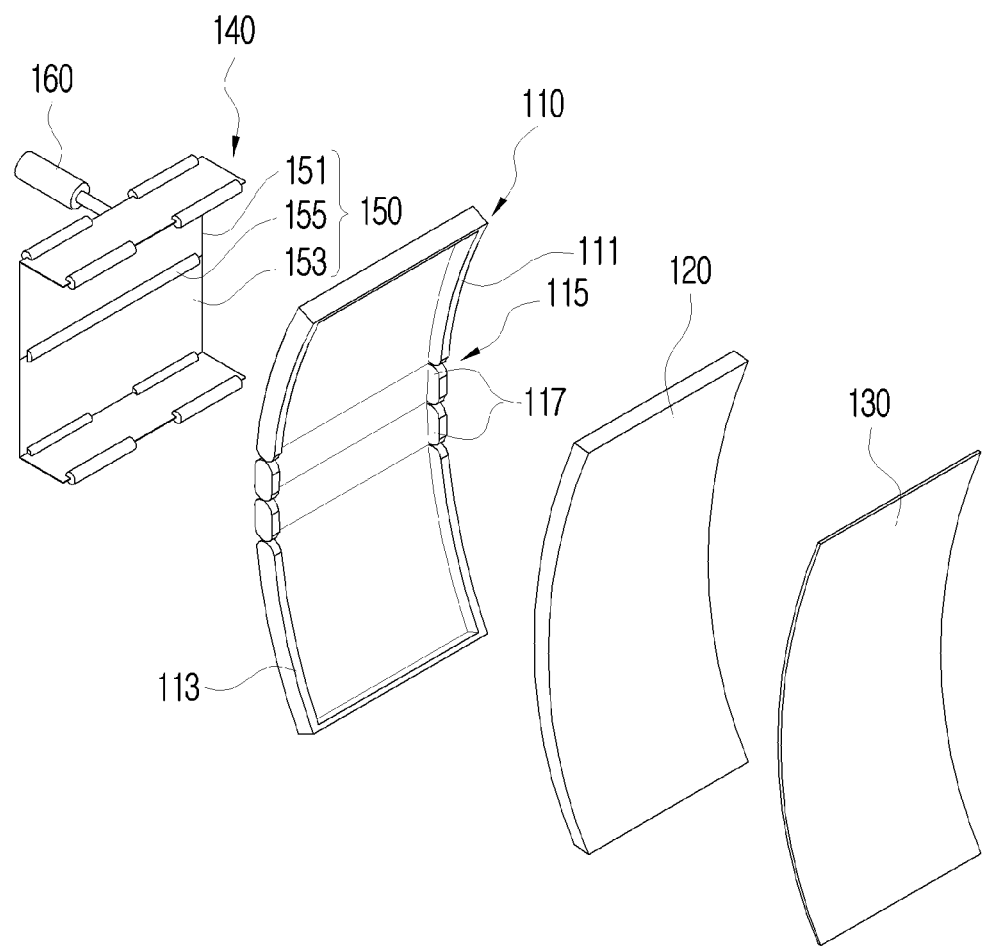
FIG. 3 is an exploded front perspective view showing the device for varying the shape of the display panel according to the first embodiment of the present invention.
Figure 4:
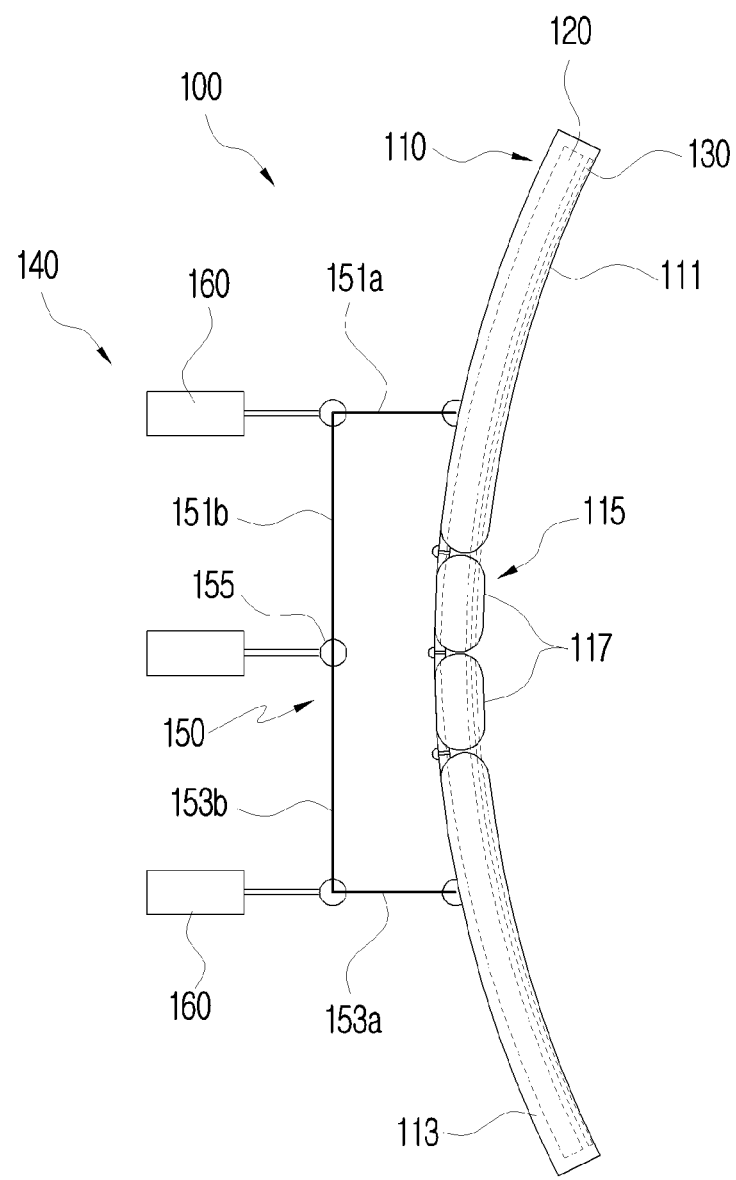
FIG. 4 is a side view of the device for varying the shape of the display panel according to the first embodiment of the present invention, showing the state in which the shape of the display panel is varied such that the display panel has a single curved surface.

100: Shape varying device 110: Variable case
111: First curved surface receiving portion 113: Second curved surface receiving portion
115: Hinge portion 117: Hinge connector
120: Backlight unit 130: Display panel
140: Driving unit 150: Driving bracket
151: First support portion 151a, 153a: Horizontal portions
151b, 153b: Vertical portions 153: Second support portion
155: Bracket connection portion 160: Variable driving mechanism
200: Curved display apparatus 210: Display main body
230: Panel position changing mechanism

BEST MODE

Hereinafter, embodiments of the present invention will be described with reference to the accompanying drawings.

As shown in FIGS. 1 to 6, a device for varying the shape of a display panel according to a first embodiment of the present invention may include a display panel 130.

The display panel 130 may be flexibly bent so as to have a desired curved shape.

The display panel 130 may be an LCD, an OLED, or a QLED. When the display panel 130 is an LCD, the thickness of the display panel may be reduced by etching such that the display panel can be easily bent.

The display panel 130 may display an image according to an electrical signal.

As shown in FIGS. 1 to 6, the device for varying the shape of the display panel according to the first embodiment of the present invention may include a variable case 110.

The variable case 110 may support the display panel 130, which is flexibly bent, in a curved shape, and may vary the curved display panel 130 into another curved shape.

The variable case 110 may include a first curved surface receiving portion 111, a second curved surface receiving portion 113, and a hinge portion 115.

The first curved surface receiving portion 111 may fix one end of the display panel 130 in a state of being bent in a curved shape, and the second curved surface receiving portion 113 may fix the other end of the display panel 130 in a state of being bent in a curved shape.

The first curved surface receiving portion 111 and the second curved surface receiving portion may be bent at a predetermined reference curvature such that one end and the other end of the display panel 130 are received therein or attached thereto in order to fix the one end and the other end of the display panel 130 in a state of being bent in a curved shape.

Meanwhile, the first curved surface receiving portion 111 and the second curved surface receiving portion may be formed so as to have single curved surfaces with the same origin, whereby the display panel 130 may be installed so as to generally have the same curvature in the state in which the display panel 130 is installed in the first curved surface receiving portion 111 and the second curved surface receiving portion 113.

The hinge portion 115 may connect the first curved surface receiving portion 111 and the second curved surface receiving portion 113 to each other such that the first curved surface receiving portion and the second curved surface receiving portion can be turned relative to each other.

In the first embodiment, as described and shown in the drawings, the first curved surface receiving portion 111 and the second curved surface receiving portion 113 are configured such that the display panel 130 is bent upwards and downwards at the predetermined reference curvature, and the first curved surface receiving portion 111 and the second curved surface receiving portion 113 are connected to each other via the hinge portion 115 such that the first curved surface receiving portion and the second curved surface receiving portion can be turned about the hinge portion 115 upwards and downwards relative to each other.

Alternatively, the first curved surface receiving portion 111 and the second curved surface receiving portion 113 may be configured such that the display panel 130 is bent leftwards and rightwards at a predetermined reference curvature, and the first curved surface receiving portion 111 and the second curved surface receiving portion 113 may be connected to each other via the hinge portion 115 such that the first curved surface receiving portion and the second curved surface receiving portion can be turned about the hinge portion 115 leftwards and rightwards relative to each other.

The hinge portion 115 may include a hinge connector 117.

The hinge connector 117 may prevent damage to the display panel due to an abrupt change in curvature of a bent portion when the first curved surface receiving portion 111 and the second curved surface receiving portion 113 are turned about the hinge portion 115.

The first curved surface receiving portion 111 and the second curved surface receiving portion 113 may be turnably coupled to opposite ends of the hinge connector 117 in the state in which the first curved surface receiving portion 111 and the second curved surface receiving portion 113 are spaced apart from each other by a predetermined distance such that each of the first curved surface receiving portion 111 and the second curved surface receiving portion 113 can be turned about a corresponding one of the coupled portions.

The hinge connector 117 may be configured such that a plurality of hinge connectors 117 is turnably connected to each other at facing ends thereof and the first curved surface receiving portion 111 and the second curved surface receiving portion 113 are turnably connected to opposite ends of a connection assembly constituted by the plurality of hinge connectors 117, respectively.

In the first embodiment, two hinge connectors 117 are connected to each other, and the first curved surface receiving portion 111 and the second curved surface receiving portion 113 are turnably connected to ends of the two hinge connectors 117, respectively.

In the state in which the first curved surface receiving portion 111 and the second curved surface receiving portion 113 connected to each other via the hinge portion 115 fix the display panel 130 received therein in a bent state so as to generally have the same curvature, the first curved surface receiving portion 111 may be turned about the hinge portion 115 relative to the second curved surface receiving portion 113 so as to be further bent toward the front or the rear of the display panel 130, whereby it is possible to bend the display panel 130 so as to have a curved surface with a curvature different from the curvature of the first curved surface receiving portion 111 and the second curved surface receiving portion 113.

In addition, the second curved surface receiving portion 113 may be turned about the hinge portion 115 relative to the first curved surface receiving portion 111 so as to be further bent toward the front or the rear of the display panel 130, whereby it is possible to bend the display panel 130 so as to have a curved surface with a curvature different from the curvature of the first curved surface receiving portion 111 and the second curved surface receiving portion 113.

Of course, the first curved surface receiving portion 111 and the second curved surface receiving portion 113 may be equally turned about the hinge portion 115 toward the front or the rear of the display panel 130, whereby it is possible to bend the display panel 130 so as to be further folded or unfolded in the same direction.

When the hinge portion 115 is constituted by a hinge connector 117, even though the display panel 1130 is bent at the same angle, the bent angle of the display panel 130 is reduced at the part of the display panel 130 corresponding to the hinge connector 117, whereby it is possible to minimize damage to the display panel 130 due to bending of the display panel 130.

When the hinge portion 115 is constituted by a plurality of hinge connectors 117 connected to each other, the curvature of the bent portion of the display panel 130 may be further reduced, whereby it is possible to minimize damage to the display panel 130 due to bending of the display panel.

When the first curved surface receiving portion 111 and the second curved surface receiving portion 113 are turned about the hinge portion 115 toward the rear of the display panel 113 in the state in which the first curved surface receiving portion 111 and the second curved surface receiving portion 113 are bent toward the front of the display panel 130 so as to have a concave curved surface when the display panel 130 is viewed from the front, the part of the display panel 130 located at the hinge portion 115 relatively protrudes to the front, whereby it is possible to bend the display panel 130 so as to have a convex curved surface reverse to opposite ends of the display panel 130 located at the first curved surface receiving portion 111 and the second curved surface receiving portion 113.

In the first embodiment, the display panel 130 may be formed so as to have a concave curved surface when the first curved surface receiving portion 111 and the second curved surface receiving portion 113 are viewed from the front of the display panel 130, whereby the display panel 130 may generally have a concave shape in the initial state thereof.

When the first curved surface receiving portion 111 and the second curved surface receiving portion 113 are turned about the hinge portion 115 toward the front of the display panel 130, the middle portion of the display panel 130 is bent into a concave shape reverse to the opposite ends of the display panel 130, which are convex, whereby it is possible to vary the shape of the display panel 130 having the single curved surface into a shape having a plurality of curved surfaces.

The variable case 110 may include a backlight unit 120.

The backlight unit 120 may provide light such that the display panel can display an image using bright light.

The backlight unit 120 may be located in the variable case 110 at the rear of the display panel 130, and may be installed in the variable case 110 so as to emit light to the front of the display panel 130, which displays an image.

Since the backlight unit 120 is installed in the variable case 110, the backlight unit may be equally bent together with the display panel 130 when the shape of the variable case 110 is varied, whereby the shape of the backlight unit may be varied.

The backlight unit 120 may include a light guide plate, and a light source configured to emit light may be installed at a rear surface of the light guide plate, or light may be emitted from the circumference of the light guide plate such that light can be emitted toward the front of the display panel 130 through the light guide plate.

In addition, the backlight unit 120 may diffuse light emitted from the light source such that the light emitted from the light source can be uniformly diffused over the entirety of the display panel 130. To this end, a diffusion plate may be installed between the light guide plate and the display panel 130.

In addition, the backlight unit 120 may include a reflection plate configured to reflect light emitted from the light source to the front of the display panel 130, and the reflection plate may be installed between the variable case 110 and the light guide plate.

As shown in FIGS. 1 to 6, the device 100 for varying the shape of the display panel according to the first embodiment of the present invention may include a driving unit 140.

The driving unit 140 may drive the variable case 110 such that the shape of the display panel 130 is varied.

Meanwhile, the driving unit 140 may include a driving bracket 150 and a variable driving mechanism 160.

The driving bracket 150 may be installed at the rear of the variable case 110 so as to vary the variable case 110 such that the first curved surface receiving portion 111, the second curved surface receiving portion 113, or the hinge portion 115 is pushed or pulled in order to vary the shape of the display panel 130.

The driving bracket 150 may be installed at the rear of the variable case 110 so as to be attached to the variable case 110 such that the hinge portion 115, the first curved surface receiving portion 111, or the second curved surface receiving portion 113 is pushed or pulled.

The driving bracket 150 may include a first support portion 151 coupled to the first curved surface receiving portion 111, a second support portion 153 coupled to the second curved surface receiving portion 113, and a bracket connection portion 155 configured to connect the first support portion 151 and the second support portion 153 to each other so as to be turnable relative to each other on the same axis as the hinge portion 115.

Meanwhile, the first support portion 151 and the second support portion 153 may be coupled to the first curved surface receiving portion 111 and the second curved surface receiving portion 113 so as to be turnable upwards and downwards.

The first support portion 151 and the second support portion 153 may respectively include horizontal portions 151a and 153a extending to the rear of the variable case 110 and vertical portions 151b and 153b extending from distal ends of the horizontal portions 151a and 153a in a direction toward each other. The vertical portions 151b and 153b, which face each other, may be connected to each other via the bracket connection portion 155 such that the bracket connection portion 155 is located at the rear of the variable case 110 so as to be spaced apart therefrom.

The first support portion 151 may be coupled to the first curved surface receiving portion 111 via a hinge pin so as to be turnable upwards and downwards, and the second support portion 153 may also be coupled to the second curved surface receiving portion 113 via a hinge pin so as to be turnable upwards and downwards.

In addition, the vertical portions 151b and 153b and the horizontal portions 151a and 153a, which constitute the first support portion 151 and the second support portion 153, may be coupled to each other via hinge pins so as to be turnable relative to each other.

The variable driving mechanism 160 may drive the driving bracket 150 such that the driving bracket 150 is pushed in a direction in which the display panel 130 is located, i.e. forwards, or pulled in a direction opposite thereto, i.e. rearwards, so as to change the shape of the variable case 110, thereby varying the shape of the display panel 130.

The variable driving mechanism 160 may drive the driving bracket 150 so as to pull or push the first support portion 151 and the second support portion 153 such that the variable case 110 is inclined forwards or rearwards by the first support portion 151 and the second support portion 153.

The variable driving mechanism 160 may be implemented by a cylinder configured such that a piston shaft is advanced and retreated by hydraulic pressure, pneumatic pressure, or an electric motor.

In the first embodiment, the variable driving mechanism 160 is implemented by a cylinder; however, the variable driving mechanism 160 may be implemented by any one of various mechanical structures configured to pull or push the first support portion 151 and the second support portion 153, such as gear connection, belt driving, or wire driving.

The variable driving mechanism 160 may be installed at each of the part at which the vertical portion 151b and the horizontal portion 151a of the first support portion 151 are connected to each other, the part at which the vertical portion 153b and the horizontal portion 153a of the second support portion 153 are connected to each other, and the part at which the first support portion 151 and the second support portion 153 are connected to each other via the bracket connection portion 155 so as to pull or push each connection part, thereby varying the shape of the variable case 110.

Figure 5:
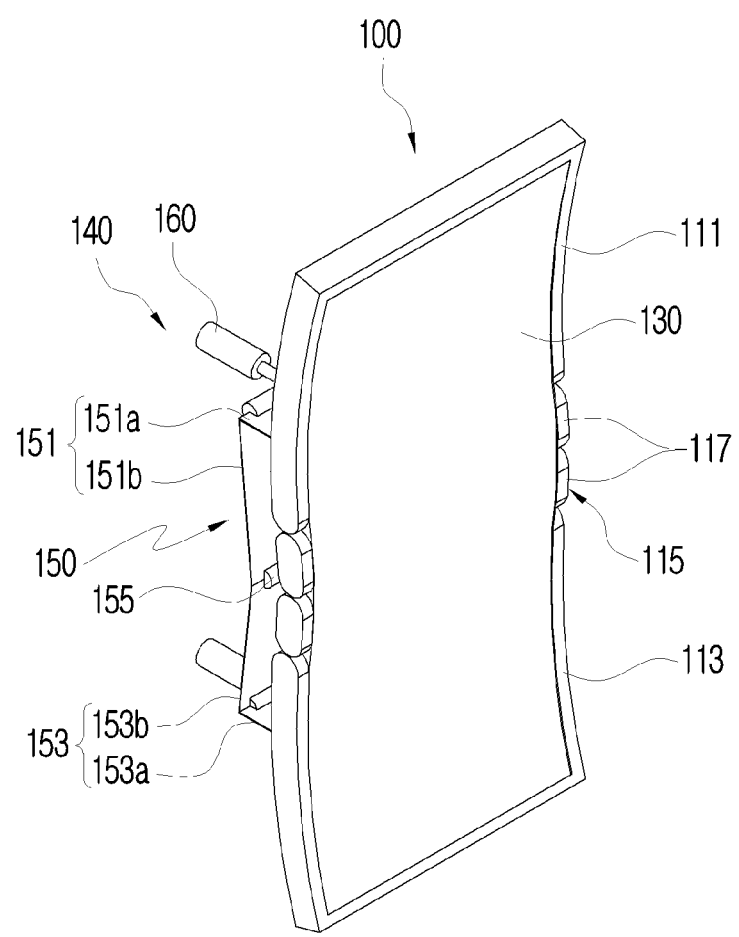
FIG. 5 is a front perspective view of the device for varying the shape of the display panel according to the first embodiment of the present invention, showing the state in which the shape of the display panel is varied such that the display panel has a plurality of curved surfaces.
Figure 6:
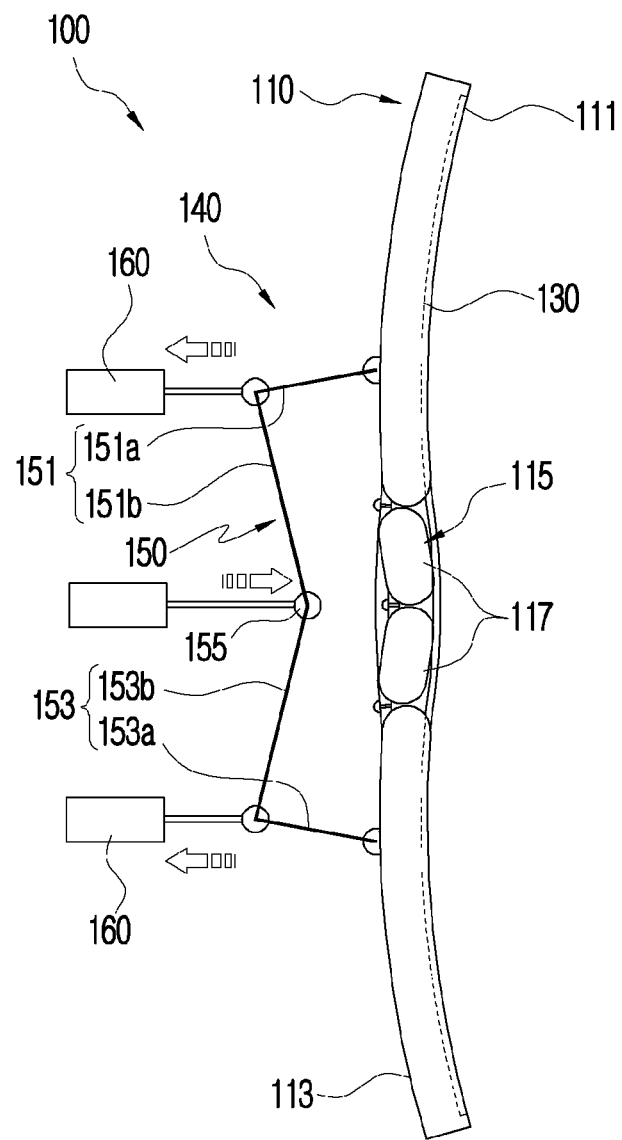
FIG. 6 is a side view of the device for varying the shape of the display panel according to the first embodiment of the present invention, showing the state in which the shape of the display panel is varied such that the display panel has a plurality of curved surfaces.

For example, when the part at which the vertical portion 151b and the horizontal portion 151a of the first support portion 151 are connected to each other via the hinge pin and the part at which the vertical portion 153b and the horizontal portion 153a of the second support portion 153 are connected to each other via the hinge pin are pulled toward the rear of the variable case 110 by the variable driving mechanisms 160 and the bracket connection portion 155 is pushed toward the front of the variable case 110 by the variable driving mechanism 160 located at the bracket connection portion, the first curved surface receiving portion 111 and the second curved surface receiving portion 113 of the variable case 110 may be unfolded about the hinge portion 115, and the hinge portion 115 may protrude toward the front of the display panel 130, whereby the shape of the display panel 130 having a single curved surface may be varied to the shape of the display panel 130 having three curved surfaces (see FIGS. 5 and 6).

Of course, when the shape of the display panel 130 is varied such that the display panel has three curved surfaces, the curved surface located at the hinge portion 115 may be varied to a curved surface reverse to the curved surfaces of the first curved surface receiving portion 111 and the second curved surface receiving portion 113 about the display panel 130.

When the part at which the vertical portion 151b and the horizontal portion 151a of the first support portion 151 are connected to each other via the hinge pin and the part at which the vertical portion 153b and the horizontal portion 153a of the second support portion 153 are connected to each other via the hinge pin are pushed toward the front of the variable case 110 and the part at which the hinge portion 115 is located is pulled toward the rear of the variable case 110 by the variable driving mechanisms 160 in the state in which the display panel 130 is varied to a shape having three curved surfaces, the protruding parts of the display panel 130 return to the original positions thereof, whereby the shape of the display panel 130 may be varied to the shape of the display panel 130 generally having a single curved surface with the same curvature.

Of course, when only the first support portion 151 or the second support portion 153 is pulled or pushed by the variable driving mechanism 160, the shape of the display panel 130 may be varied to a shape having two curved surfaces.

Hereinafter, the operation and effect of each component described above will be described.

In the device 100 for varying the shape of the display panel according to the first embodiment of the present invention, the first curved surface receiving portion 111 and the second curved surface receiving portion 113 are disposed in up-down symmetry, and the first curved surface receiving portion 111 and the second curved surface receiving portion 113 are connected to each other via the hinge portion 115 to constitute the variable case 110.

The plurality of hinge connectors 117 of the hinge portion 115 is coupled to each other so as to be turnable relative thereto in a direction corresponding to the direction in which the first curved surface receiving portion 111 and the second curved surface receiving portion 113 are turned, the first curved surface receiving portion 111 is turnably coupled to one end of the connection assembly constituted by the plurality of hinge connectors 117, and the second curved surface receiving portion 113 is turnably coupled to the other end of the connection assembly constituted by the plurality of hinge connectors 117.

The backlight unit 120, the shape of which is varied depending on the shape of the variable case 110, is installed in the variable case 110, and the display panel 130, which is flexibly bent, is installed at the front of the backlight.

When the display panel 130 is installed in the variable case 110, as described above, the display panel 130 may have a shape of a curved display panel 130 generally having a single curved surface with the same origin, since the origins of the curved surfaces of the first curved surface receiving portion 111 and the second curved surface receiving portion 113 are the same.

The driving unit 140, which is configured to vary the shape of the variable case 110, is installed at the rear of the variable case 110, and the driving unit 140 is configured such that the driving bracket 150 is installed at the rear of the variable case 110 and the variable driving mechanism 160 is connected to the driving bracket 150, whereby the variable driving mechanism 160 drives the driving bracket 150.

The first support portion 151 of the driving bracket 150 is turnably installed at the first curved surface receiving portion 111, and the second support portion 153 is turnably installed at the second curved surface receiving portion 113.

The first support portion 151 and the second support portion 153 are coupled to each other via the bracket connection portion 155 so as to be turnable relative to each other, and the variable driving mechanism 160 may be installed at each of the part at which the horizontal portion 151a and the vertical portion 151b of the first support portion 151 are connected to each other, the part at which the horizontal portion 153a and the vertical portion 153b of the second support portion 153 are connected to each other, and the part at which the bracket connection portion 155 is installed.

The device 100 for varying the shape of the display panel according to the first embodiment of the present invention, configured as described above, may be operated according to an image displayed on the display panel 130, the occurrence of a specific event, or user manipulation in order to vary the shape of the display panel 130.

When the variable driving mechanisms 160 of the device 100 for varying the shape of the display panel are operated in order to vary the shape of a display panel bent at a predetermined curvature, the variable driving mechanisms 160 push the first support portion 151 and the second support portion 153 toward the front at which the display panel 130 is located, and the variable driving mechanism 160 located at the bracket connection portion 155 pulls the bracket connection portion 155 toward the rear of the display panel 130.

When the variable driving mechanisms 160 are operated, the first curved surface receiving portion 111 and the second curved surface receiving portion 113 are unfolded, the hinge portion 115 relatively protrudes toward the front of the display panel 130, whereby the shape of the display panel 130 is varied to a shape having three curved surfaces with different origins configured such that the upper and lower parts are concave and the middle part is convex.

When the variable driving mechanisms 160 are operated to push the first curved surface receiving portion 111 and the second curved surface receiving portion 113 toward the front of the display panel 130 and to pull the bracket connection portion 155, which has been pulled toward the front, toward the rear of the display panel 130 in the state in which the shape of the display panel 130 is varied to a shape having three curved surface, the middle part of the display panel, which has convexly protruded, is deformed so as to be concave inwards, whereby the shape of the display panel 130 is varied to a shape generally having a single curved surface.

Here, when the first curved surface receiving portion 111 or the second curved surface receiving portion 113 is pulled or pushed toward the front or the rear of the display panel 130 by the variable driving mechanism 160 in the state in which the display panel 130 has a single curved surface, the shape of the display panel 130 may be varied to a shape having two curved surfaces with different origins.

Consequently, it is possible for the device 100 for varying the shape of the display panel according to the embodiment of the present invention to vary the shape of the display panel 130 having a single curved surface to a shape of the display panel 130 having a plurality of curved surfaces, whereby it is possible to provide various visual effects, and it is possible to improve the visual effects and the concentration of attention based on the varied shape.

Hereinafter, a device 100 for varying the shape of a display panel according to a second embodiment of the present invention will be described.

The device 100 for varying the shape of the display panel according to the second embodiment of the present invention has the same configuration and the same effect as the device 100 for varying the shape of the display panel according to the first embodiment, and the same components are denoted by the same reference symbols.

Figure 7:
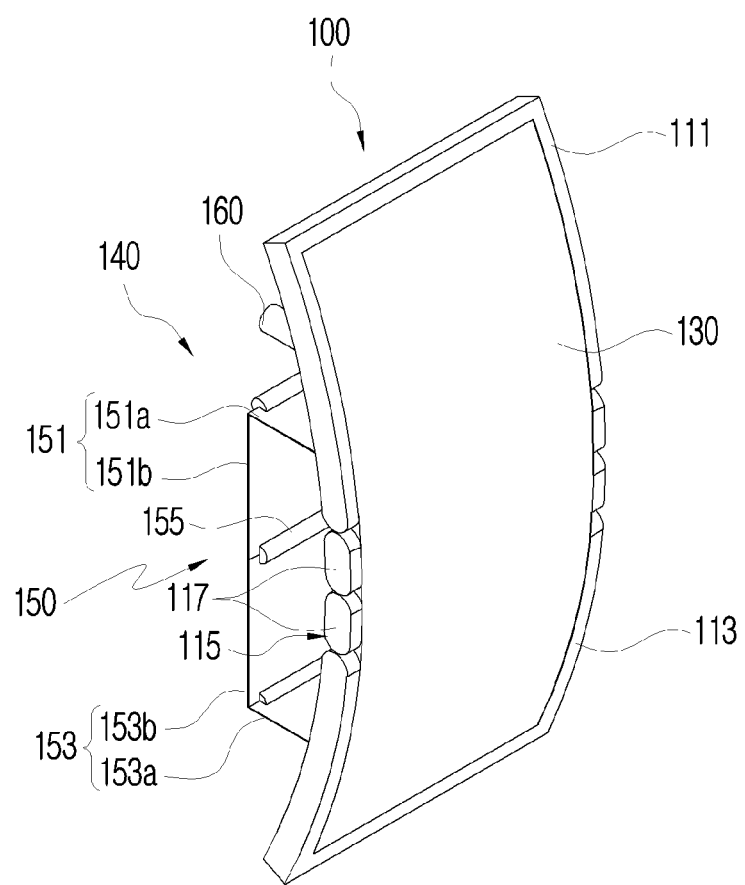
FIG. 7 is a front perspective view showing a device for varying the shape of a display panel according to a second embodiment of the present invention.
Figure 8:
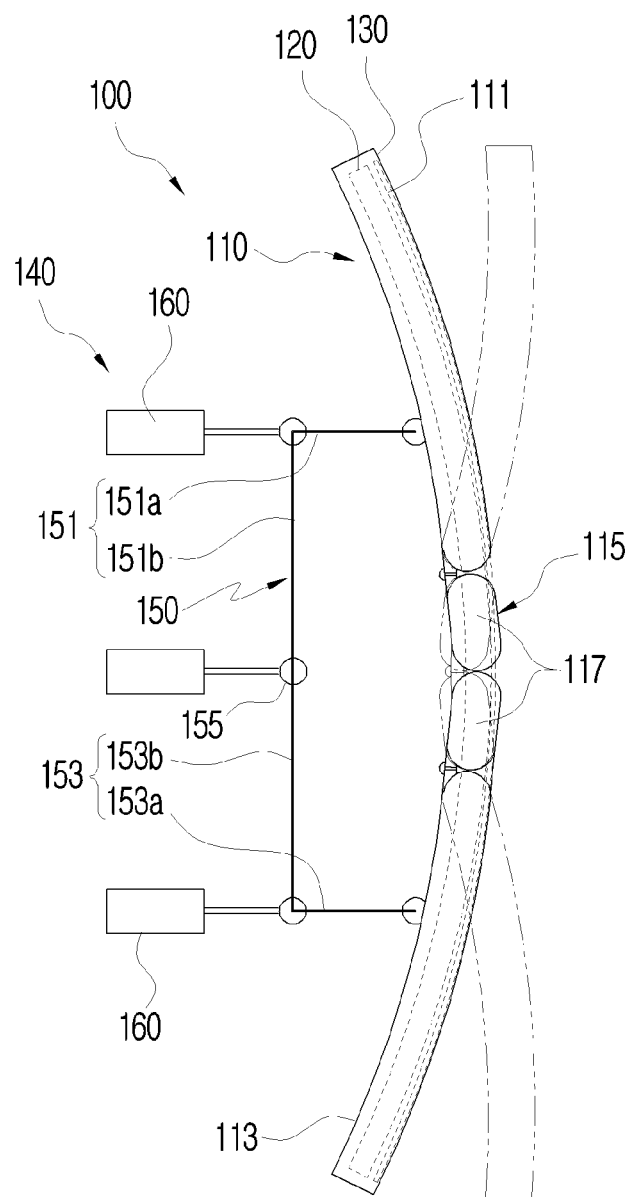
FIG. 8 is a side view of the device for varying the shape of the display panel according to the second embodiment of the present invention, showing the state in which the shape of the display panel is varied such that the display panel has a plurality of curved surfaces.

As shown in FIGS. 7 and 8, the second embodiment is different in an initial shape of the display panel 130 from the first embodiment.

In the first embodiment, the display panel 130 is generally bent in a concave shape when the display panel 130 is viewed from the front. In the second embodiment, on the other hand, the display panel 130 is generally bent in a convex shape when the display panel is viewed from the front.

In the device 100 for varying the shape of the display panel according to the second embodiment, as described above, when the first curved surface receiving portion 111 and the second curved surface receiving portion 113 are pushed toward the front of the display panel 130 about the hinge portion 115 by the driving unit 140 and the hinge portion 115 is pulled toward the rear of the display panel 130, the shape of the display panel 130 having a single convex curved surface may be varied to a shape of the display panel 130 having a plurality of curved surfaces configured such that opposite ends of the display panel are convex and the middle of the display panel is concave.

Hereinafter, a curved display apparatus 200 equipped with a device for varying the shape of a display panel according to an embodiment of the present invention will be described.

The curved display apparatus 200 equipped with the device for varying the shape of the display panel according to the embodiment of the present invention may be used in any of various forms, such as a monitor configured to output an image, digital signage, or a game machine.

Figure 9:
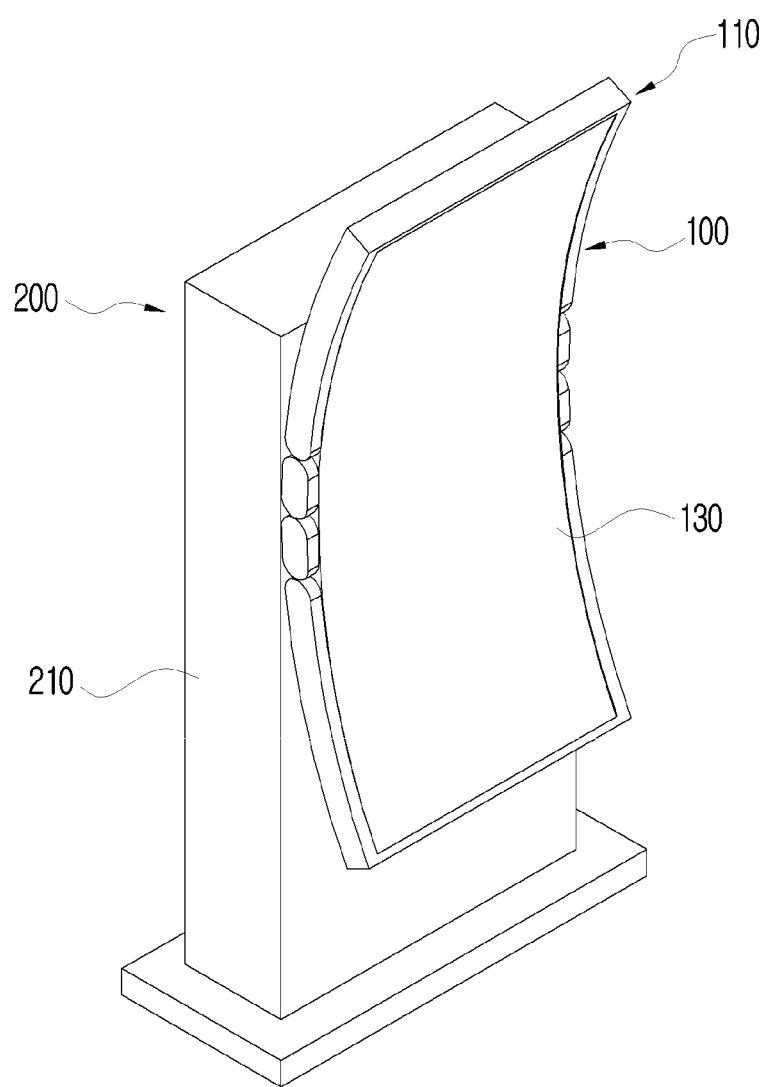
FIG. 9 is a perspective view showing a curved display apparatus equipped with a device for varying the shape of a display panel according to an embodiment of the present invention.

As shown in FIG. 9, the curved display apparatus 200 equipped with the device for varying the shape of the display panel according to the embodiment of the present invention may include a device 100 for varying the shape of the display panel.

In the device 100 for varying the shape of the display panel, a flexible display panel 130 may be installed at a variable case 110 such that the display panel 130 is bent into a single curved surface, and the display panel 130 may be bent such that the shape of the display panel is varied so as to have a plurality of curved surfaces.

The device 100 for varying the shape of the display panel according to any one of the first and second embodiments of the present invention may be applied to the device 100 for varying the shape of the display panel in this embodiment, and therefore a detailed description thereof will be omitted.

The curved display apparatus 200 equipped with the device 100 for varying the shape of the display panel according to the embodiment of the present invention may include a display main body 210.

The display main body 210 may be configured in a box form, such as a game machine, configured to receive the entirety of the device 100 for varying the shape of the display panel in the state in which only the display panel 130 is exposed through a sight window, or may be configured in a stand form configured to fix the display panel 130 in the state in which the display panel stands on the ground.

Figure 10:
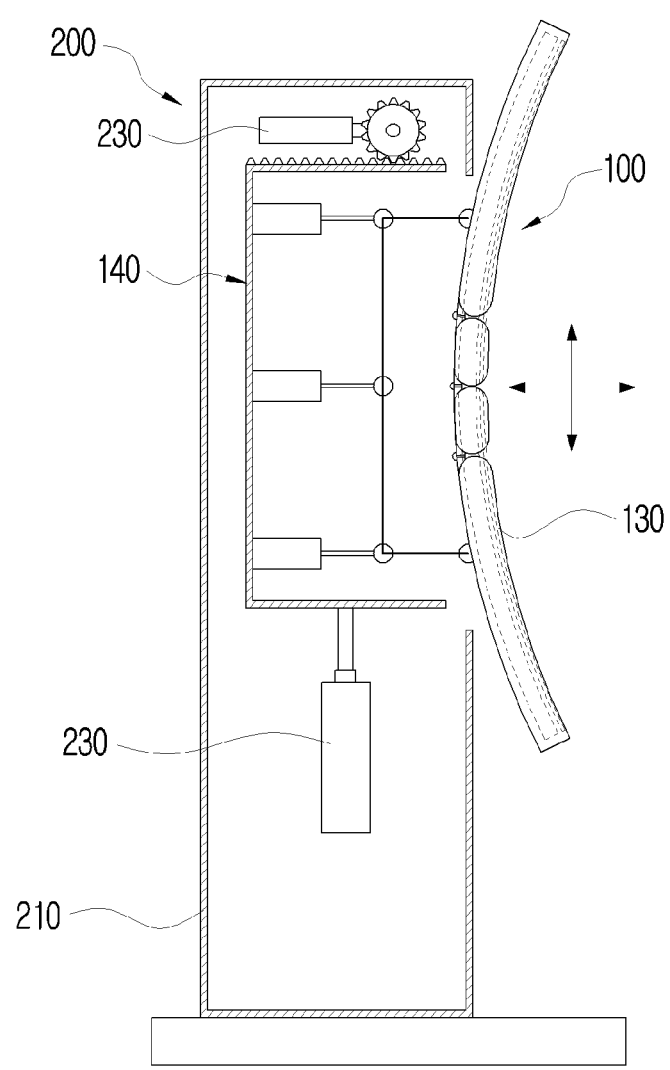
FIG. 10 is a side view showing the curved display apparatus equipped with the device for varying the shape of the display panel according to the embodiment of the present invention.

As shown in FIGS. 10 and 11, the curved display apparatus 200 equipped with the device 100 for varying the shape of the display panel according to the embodiment of the present invention may include a panel position changing mechanism 230.

The panel position changing mechanism 230 may change the position of the device 100 for varying the shape of the display panel in the display main body 210 such that the position of the display panel is changed in order to achieve visual effects or to prevent falling of the display main body due to change in center of gravity of the display panel when the shape of the display panel is varied by the device 100 for varying the shape of the display panel.

For example, when the display main body 210 is configured in a stand form, the center of gravity of the display panel 130 may be changed when the shape of the display panel 130 is varied by the device 100 for varying the shape of the display panel, whereby the display main body 210 may fall to the ground. Consequently, the panel position changing mechanism 230 may change the position of the device 100 for varying the shape of the display panel upwards or downwards in the display main body 210 based on the varied shape of the display panel 130.

As another example, when the device 100 for varying the shape of the display panel varies the shape of the display panel 130 based on an image displayed on the display panel 130, the panel position changing mechanism 230 may move the display panel 130 forwards or rearwards or may move the display panel in any of various directions, such as an upward direction, a downward direction, a leftward direction, or a rightward direction, in the display main body 210, whereby it is possible to improve visual effects.

Here, a plurality of panel position changing mechanisms 230 may be installed in the display main body 210 depending on the position of the device 100 for varying the shape of the display panel to be changed, whereby it is possible to change the position of the device 100 for varying the shape of the display panel in various directions using the panel position changing mechanisms 230.

The panel position changing mechanism 230 may move the entirety of the device 100 for varying the shape of the display panel in the display main body 210 in order to change the position of the device for varying the shape of the display panel, and the panel position changing mechanism 230 may be implemented by any one of various mechanical mechanisms, such as a cylinder configured to be operated by pneumatic pressure, hydraulic pressure, or an electric motor, a rack and pinion, link connection, or gear engagement.

Of course, when configuration is made such that the position of the device 100 for varying the shape of the display panel is changed in various directions by the plurality of panel position changing mechanisms 230, the panel position changing mechanisms 230 may be implemented by different mechanical mechanisms.

In the curved display apparatus 200 equipped with the device 100 for varying the shape of the display panel, configured as described above, the variable driving mechanism 160 may be operated to vary the shape of the display panel 130 having a single curved surface to a shape having a plurality of curved surfaces with different origins based on an image displayed on the display panel 130, or the shape of the display panel 130 may be varied first by the variable driving mechanism 160 and then an image suitable for the varied shape may be displayed.

In addition, when the shape of the display panel is varied by the device 100 for varying the shape of the display panel, the position of the display panel in the display main body 210 may be changed by the panel position changing mechanism 230, whereby it is possible to change the center of gravity of the display panel, and therefore it is possible to prevent falling of the display main body and to further improve the visual effects.

Consequently, it is possible for the display apparatus equipped with the device 100 for varying the shape of the display panel according to the embodiment of the present invention to vary the shape of the display panel 130 having a single curved surface to a shape of the display panel 130 having a plurality of curved surfaces, whereby it is possible to provide various visual effects, and it is possible to improve the visual effects and the concentration of attention based on the varied shape.

Although the embodiment of the present invention has been described above, the scope of right of the present invention is not limited thereto and includes all alterations and modifications within a range easily changed and recognized as being equivalent by a person having ordinary skill in the art to which the present invention pertains from the embodiment of the present invention.

The invention claimed is:

1. A device for varying a shape of a display panel, the device comprising: a variable case configured to allow a flexible display panel to be installed and enclosed therein, a shape of the variable case being varied to vary a shape of the display panel; and a driving unit configured to drive the variable case, wherein the variable case comprises: a first curved surface receiving portion configured to fix one end of the display panel in a state of being bent in a curved shape; a second curved surface receiving portion configured to fix the other end of the display panel in a state of being bent in a curved shape so as to constitute a single curved surface together with the one end of the display panel; and a hinge portion configured to turnably connect the first curved surface receiving portion and the second curved surface receiving portion to each other, the hinge portion being configured to turn the first curved surface receiving portion and the second curved surface receiving portion such that the single curved surface of the display panel is varied to a plurality of curved surfaces; and the hinge portion comprises a plurality of hinge connectors hingedly connected to each other so as to be turnable relative to each other, the plurality of hinge connectors being configured to hingedly connect the first curved surface receiving portion and the second curved surface receiving portion to each other; and the hinge portion turns the first curved surface receiving portion or the second curved surface receiving portion so as to have a curved surface reverse to the curved surface of the one end or the other end of the display panel; and the driving unit comprises a driving bracket installed at a rear of the variable case, the driving bracket comprises: a first support portion with a first horizontal portion turnably coupled to the first curved surface receiving portion, the first horizontal portion being configured to pull or push the first curved surface receiving portion such that the first curved surface receiving portion is turned relative to the hinge portion; a second support portion with a second horizontal portion turnably coupled to the second curved surface receiving portion, the second horizontal portion being configured to pull or push the second curved surface receiving portion such that the second curved surface receiving portion is turned relative to the hinge portion; and a bracket connection portion comprises: a first and second vertical portions hingedly connected to each other by a bracket connection portion and configured to turnably connect the first horizontal portion and the second horizontal portions respectively.

2. The device according to claim 1, wherein the driving unit comprises a variable driving mechanism configured to pull or push the driving bracket such that the first support portion and the second support portion are turned relative to the hinge portion.

3. The device according to claim 1, wherein the variable case comprises a backlight unit installed at a rear of the display panel, the backlight unit being configured to provide light to the display panel, the backlight unit being bent together with the display panel depending on change in shape of the variable case.

4. A curved display apparatus equipped with a device for varying a shape of a display panel, the curved display apparatus comprising: a device for varying a shape of a display panel, the device comprising: a variable case configured to allow a flexible display panel to be installed and enclosed therein, a shape of the variable case being varied to vary a shape of the display panel; and a driving unit configured to drive the variable case, wherein the variable case comprises: a first curved surface receiving portion configured to fix one end of the display panel in a state of being bent in a curved shape; a second curved surface receiving portion configured to fix the other end of the display panel in a state of being bent in a curved shape so as to constitute a single curved surface together with the one end of the display panel; and a hinge portion configured to turnably connect the first curved surface receiving portion and the second curved surface receiving portion to each other, the hinge portion being configured to turn the first curved surface receiving portion and the second curved surface receiving portion such that the single curved surface of the display panel is varied to a plurality of curved surfaces; a display main body configured to allow the device to be installed therein; and a panel position changing mechanism configured to change a position of the device in the display main body in order to achieve change in center of gravity or a visual effect due to change in shape of the display panel varied by the device; and the hinge portion comprises a plurality of hinge connectors hingedly connected to each other so as to be turnable relative to each other, the plurality of hinge connectors being configured to hingedly connect the first curved surface receiving portion and the second curved surface receiving portion to each other; and the hinge portion turns the first curved surface receiving portion or the second curved surface receiving portion so as to have a curved surface reverse to the curved surface of the one end or the other end of the display panel; and the driving unit comprises a driving bracket installed at a rear of the variable case, the driving bracket comprises: a first support portion with a first horizontal portion turnably coupled to the first curved surface receiving portion, the first horizontal portion being configured to pull or push the first curved surface receiving portion such that the first curved surface receiving portion is turned relative to the hinge portion; a second support portion with a second horizontal portion turnably coupled to the second curved surface receiving portion, the second horizontal portion being configured to pull or push the second curved surface receiving portion such that the second curved surface receiving portion is turned relative to the hinge portion; and a bracket connection portion comprises: a first and second vertical portions hingedly connected to each other by a bracket connection portion and configured to turnably connect the first horizontal portion and the second horizontal portions respectively.

5. The curved display apparatus according to claim 4, wherein the driving unit comprises a variable driving mechanism configured to pull or push the driving bracket such that the first support portion and the second support portion are turned relative to the hinge portion.

6. The curved display apparatus according to claim 4, wherein the variable case comprises a backlight unit installed at a rear of the display panel, the backlight unit being configured to provide light to the display panel, the backlight unit being bent together with the display panel depending on change in shape of the variable case.

\* \* \* \* \*